(12) United States Patent
Yabe

(10) Patent No.: US 9,022,716 B2
(45) Date of Patent: May 5, 2015

(54) WORK CONVEYING SYSTEM

(75) Inventor: Kazunori Yabe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 117 days.

(21) Appl. No.: 13/094,072

(22) Filed: Apr. 26, 2011

(65) Prior Publication Data
US 2011/0280691 A1 Nov. 17, 2011

(30) Foreign Application Priority Data

May 12, 2010 (JP) ................................. 2010-109925

(51) Int. Cl.
*H01L 21/677* (2006.01)
*B25J 9/00* (2006.01)
*G05B 19/418* (2006.01)

(52) U.S. Cl.
CPC ......... *B25J 9/0084* (2013.01); *H01L 21/67745* (2013.01); *B25J 9/0093* (2013.01); *G05B 19/4182* (2013.01); *Y10S 414/136* (2013.01)

(58) Field of Classification Search
CPC .............. B23Q 7/00; B65H 1/00; B65H 5/04; B25J 9/0084; B25J 9/0093; G05B 19/4182; H01L 21/677; H01L 21/67703; H01L 21/67718; H01L 21/67745
USPC ............ 29/33 P; 414/222.01, 222.03, 222.13, 414/224.01, 225.01, 935, 941; 901/6, 7, 8
See application file for complete search history.

(56) References Cited

U.S. PATENT DOCUMENTS

| | | | |
|---|---|---|---|
| 4,909,695 A * | 3/1990 | Hurwitt et al. ................ | 414/217 |
| 4,915,564 A * | 4/1990 | Eror et al. ..................... | 414/217 |
| 5,005,274 A * | 4/1991 | Timell ........................... | 29/33 P |
| 6,168,667 B1 * | 1/2001 | Yoshioka ....................... | 118/715 |
| 6,684,488 B2 * | 2/2004 | Menzio .......................... | 29/711 |
| 7,331,439 B2 * | 2/2008 | Degain et al. ............... | 198/339.1 |
| 7,484,922 B2 * | 2/2009 | Harsch et al. ............... | 414/749.1 |
| 2002/0189085 A1 | 12/2002 | Menzio | |
| 2006/0258128 A1 * | 11/2006 | Nunan et al. ................... | 438/510 |
| 2007/0077135 A1 | 4/2007 | Harsch et al. | |
| 2008/0075565 A1 * | 3/2008 | Grob ......................... | 414/222.13 |
| 2011/0280691 A1 * | 11/2011 | Yabe ........................ | 414/222.01 |

FOREIGN PATENT DOCUMENTS

| | | |
|---|---|---|
| CN | 101480800 A | 7/2009 |
| JP | S62-081230 A | 4/1987 |
| JP | H02-033927 U | 3/1990 |
| JP | H03-294127 A | 12/1991 |
| JP | 06-156667 A | 6/1994 |
| JP | 2008-084983 A | 4/2008 |

OTHER PUBLICATIONS

Chinese Office Action dated Mar. 14, 2013, in related Chinese Patent Application No. 201110122046.7 (with English translation).
Aug. 29, 2013 Chinese Office Action in Chinese Patent Application No. 201110122046.7 (with English translation).

* cited by examiner

*Primary Examiner* — Dean Kramer
*Assistant Examiner* — Brendan Tighe
(74) *Attorney, Agent, or Firm* — Fitzpatrick, Cella, Harper & Scinto

(57) ABSTRACT

A work conveying system sequentially conveys a workpiece to multiple working apparatuses and includes a rail track disposed along the multiple working apparatuses and multiple conveyor robots disposed on the rail track and movable on the rail track independently. In addition, a delivery control unit controls the multiple conveyor robots for delivering the workpiece between adjacent conveyor robots. Any one of the multiple conveyor robots can be controlled for isolated individual movement on the rail track between adjacent working apparatuses to sequentially deliver the workpiece.

4 Claims, 10 Drawing Sheets

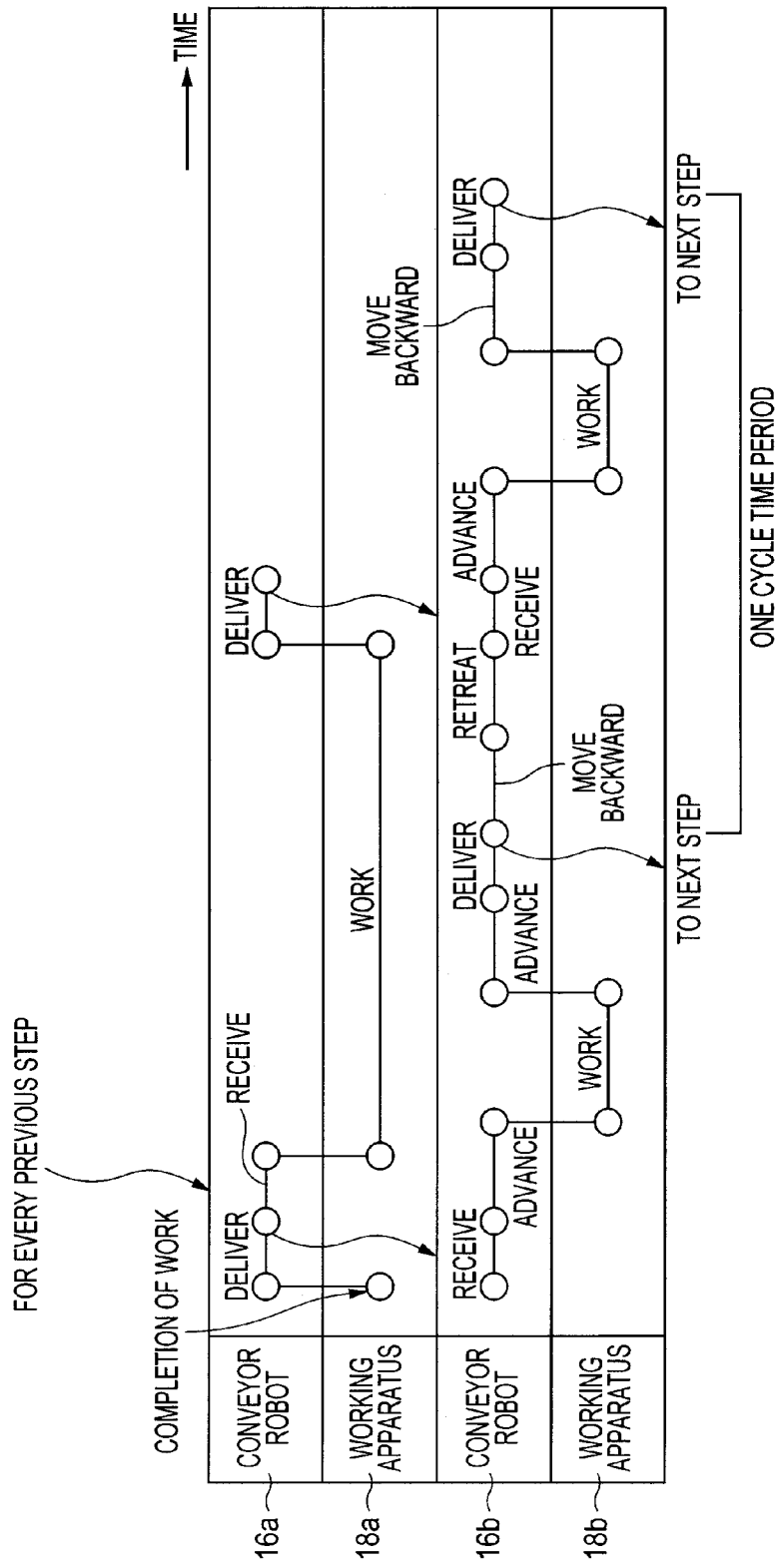

WORK CONVEYING SYSTEM

BACKGROUND OF THE INVENTION

1. Field of the Invention

The present invention relates to a work conveying system for manufacturing a product including multiple parts, such as business equipment, through sequential working steps performed by multiple working apparatuses.

2. Description of the Related Art

In a conventional production line in which business equipment and the like are produced, a workpiece is sequentially conveyed to multiple holding bases placed at certain intervals along a row of working apparatuses, and the workpiece is positioned and held by each of the holding bases at a predetermined working position. Then, working robots or the like sequentially perform an assembly work or processing on the workpiece.

FIG. 10 illustrates a work conveying system according to a conventional example. In the conveying system, workpieces 112 are intermittently conveyed on a rail track 114, and works are performed by working apparatuses 118a, 118b, and 118c disposed at stop positions of the workpieces 112. On the rail track 114, there is provided a base table 115 that advances (in an arrow direction) and retreats along the rail track 114. Multiple jigs 120a to 120c are disposed at intervals of a distance P on the base table 115. Holding bases 121a to 121c are fixed and disposed at the stop positions of the workpieces 112. The respective working apparatuses 118a, 118b, and 118c perform the works on the workpieces 112 held by the respective holding bases 121a, 121b, and 121c. After completion of the works, the workpieces 112 are disposed on the respective jigs 120a, 120b, and 120c. The base table 115 moves (advances) in the arrow direction by the distance P along the rail track 114, and accordingly the respective jigs 120a, 120b, and 120c are conveyed for next working steps. The workpieces 112, which are conveyed together with the respective jigs 120a, 120b, and 120c, are held by the holding bases for the next working steps, and then the next works are started. During the works, the base table 115 moves (retreats) in a direction opposite to the arrow direction by the distance P along the rail track 114. Through repetition of the above-mentioned operations, the workpieces 112 are sequentially conveyed. This system is generally called a shuttle conveying system.

Further, Japanese Patent Application Laid-Open No. H06-156667 discloses the shuttle conveying apparatus including the means for sliding components disposed at different pitches. The shuttle conveying apparatus includes: the shuttle member reciprocating through a stroke of a certain distance; and the multiple base table portions disposed at the same intervals. According to a cycle of ascent, advance, descent, and retreat of the shuttle member, the transportation tables on the base table portions are progressed onto the adjacent base table portions, and in addition, the base table portions are slid. This enables conveyance onto the base table portions disposed at different pitches.

However, in a production line constituted by multiple working apparatuses, the respective working apparatuses, which perform assembly or processing individually, generally have different working time periods. Further, even if using the same working apparatuses, working methods are different depending on the kind of the workpiece, and hence the working time periods may be elongated or shortened. In addition, even if using the same working apparatuses and the same kind of the workpiece, the working time periods are generally different from each other depending on an individual difference of the workpiece, an individual difference of a part to be assembled, and a state of coating applied onto the workpiece. For example, in a case of fitting and mounting a gear to a shaft mounted to the workpiece while correcting an angle of the gear to a predetermined angle, the angle of the gear gripped by the working robot differs every time, and hence a time period to correct the angle of the gear with respect to the shaft differs every time. Accordingly, there are differences in working time period, and the working time periods become longest in the multiple working apparatuses in many cases. In this case, in the conventional shuttle conveying system for conveying the workpieces in unison, conveyance is performed through a wait for completion of the working step of assembling the gear.

In general, in the conventional system, such as the shuttle conveying system, for conveying the workpieces in unison, it is necessary to convey the workpieces in unison through a wait for completion of the work of the working apparatus having the longest working time period in one cycle. Thus, a sum of the longest working time period and a conveying time period corresponds to one cycle time period, and hence any one of or both of the time periods have needed to be increased in speed (be cut) for improvement of productivity.

Further, even in the conveying system disclosed in Japanese Patent Application Laid-Open No. H06-156667, the workpieces are conveyed in unison, and hence the sum of the working time period and the conveying time period corresponds to one cycle time period. Thus, in the case where there are differences in working time period in the multiple working apparatuses, in order to cut the one cycle time period, it is necessary to increase conveying speed of the conveying apparatus or to cut the working time periods of all the working apparatuses that work for a long period of time, and hence it is difficult to improve productivity. In addition, the conveying system has structure in which the base table portion for positioning the workpiece at the working position of each of the working apparatuses is fixed and placed separately from a conveying section, and hence the entire structure of the system is complex, which is disadvantageous for space saving.

SUMMARY OF THE INVENTION

It is an object of the present invention to provide a work conveying system capable of efficiently conveying the workpiece with simpler structure and constituting a production line with high productivity.

According to the present invention, provided is a work conveying system for sequentially conveying a workpiece to multiple working apparatuses, including a rail track disposed along the multiple working apparatuses and multiple conveyor robots, which are disposed on the rail track and move on the rail track independently, in which the multiple conveyor robots include a delivery mechanism for delivering the workpiece between adjacent conveyor robots, and move on the rail track between adjacent working apparatuses, to thereby sequentially deliver the workpiece by the delivery mechanism.

Further features of the present invention will become apparent from the following description of exemplary embodiments with reference to the attached drawings.

BRIEF DESCRIPTION OF THE DRAWINGS

FIG. 2C is a diagram illustrating operation cycles according to Examples 1 and 2 of the present invention.

DESCRIPTION OF THE EMBODIMENTS

Preferred embodiments of the present invention will now be described in detail in accordance with the accompanying drawings.

Figure 1:
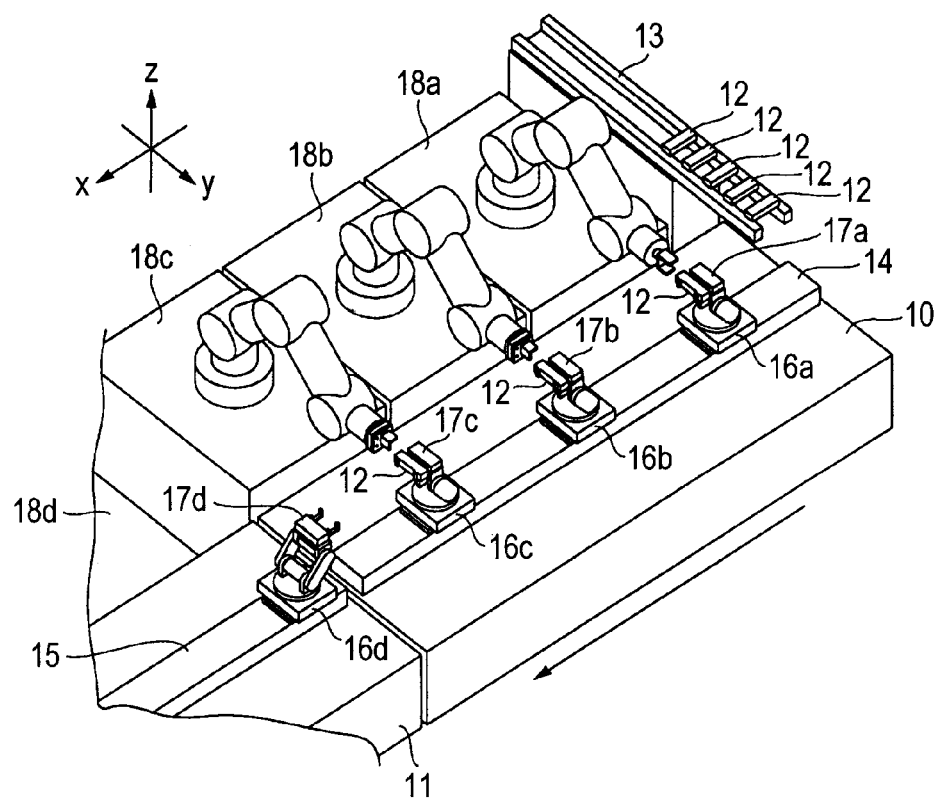
FIG. 1 is a perspective view of a work conveying system according to an embodiment of the present invention.

FIG. 1 is a perspective view of a work conveying system according to an embodiment of the present invention. When assuming that a right direction of the drawing sheet is an upstream side, conveying apparatuses 10 and 11 convey workpieces 12 in a left direction. The conveying apparatuses 10 and 11 convey the workpieces 12, which are carried in from an upstream direction by a carry-in apparatus 13, by conveyor robots 16a to 16d to working positions of working apparatuses 18a to 18d, the conveyor robots 16a to 16d being disposed on a rail track 14 of the conveying apparatus 10 and a rail track 15 of the conveying apparatus 11. In this manner, an assembly work or processing is performed. This constitutes an automated production system (production line) for manufacturing business equipment and the like, in which the conveying apparatus 10 is disposed along the multiple working apparatuses 18a, 18b, and 18c disposed adjacent to one another. Similarly, the conveying apparatus 11 is disposed along the working apparatus 18d and another working apparatus (not shown) which are disposed adjacent to each other.

The conveyor robots 16a to 16d, which are disposed adjacent to one another, respectively include hands 17a to 17d each serving as a holding unit for holding the workpiece 12. The conveying apparatuses 10 and 11 include a unit for independently reciprocating the conveyor robots 16a to 16d on the rail tracks. Each of the conveyor robots 16a to 16d independently advances to a downstream side of an arrow direction (conveying direction), and retreats to the upstream side that is opposite to the arrow direction. The movement brings two adjacent conveyor robots in close to each other, and allows the workpieces 12 to be sequentially delivered on the rail track between the adjacent working apparatuses. For example, the conveyor robot 16a performs a delivery operation together with the conveyor robot 16b, and the conveyor robot 16b performs the delivery operation together with the conveyor robot 16a or the conveyor robot 16c.

The conveyor robot 16a of the conveying apparatus holds and takes the workpiece 12 from the carry-in apparatus 13 for successively carrying the workpieces 12 into the production line, and turns by 90° around a z-axis to advance in a downstream direction. Then, the conveyor robot 16a moves to the working position corresponding to the working apparatus 18a, and stops for positioning. The working apparatus 18a performs a manufacturing work, such as assembly of parts, on the workpiece 12 held by the conveyor robot 16a. During the manufacturing work, the conveyor robot 16b turns by 180° around the z-axis so as to face the conveyor robot 16a, and then waits. When the manufacturing work of the working apparatus 18a is completed, the conveyor robot 16a advances, and conveys the workpiece 12 to a delivery position to deliver the workpiece 12 to the adjacent conveyor robot 16b. The conveyor robot 16b receives and holds the workpiece 12 held by the conveyor robot 16a, and turns by 180° around the z-axis. Then, the conveyor robot 16b moves to the working position of the working apparatus 18b, and stops for positioning. The working apparatus 18b performs a manufacturing work, such as an application work for the workpiece 12, on the workpiece 12 held by the conveyor robot 16b. During the manufacturing work, the conveyor robot 16c turns by 180° around the z-axis so as to face the conveyor robot 16b, and then waits. When the manufacturing work of the working apparatus 18b is completed, the conveyor robot 16b advances, and conveys the workpiece 12 to a delivery position to deliver the workpiece 12 to the conveyor robot 16c. The conveyor robot 16c receives and holds the workpiece 12 held by the conveyor robot 16b, and turns by 180° around the z-axis. Then, the conveyor robot 16c moves to the working position of the working apparatus 18c, and stops for positioning. The working apparatus 18c performs a manufacturing work, such as a grease application work, on the workpiece 12 held by the conveyor robot 16c. During the manufacturing work, the conveyor robot 16d turns by 180° around the z-axis so as to face the conveyor robot 16c, and then waits. When the manufacturing work of the working apparatus 18c is completed, the conveyor robot 16c advances, and conveys the workpiece 12 to a delivery position to deliver the workpiece 12 to the conveyor robot 16d. The conveyor robot 16d receives and holds the workpiece 12 held by the conveyor robot 16c, and the working apparatus 18d performs a work on the workpiece held by the conveyor robot 16d. Then, the conveyor robot 16d delivers the workpiece 12 to another conveyor robot situated in the downstream direction. Those operations are sequentially repeated to carry out production. In a case where a working time period of the working apparatus is elongated depending on every working apparatus or the kind of the workpiece, one cycle time period is cut by changing the position to deliver the workpiece as described below.

Example 1

Figure 2A:
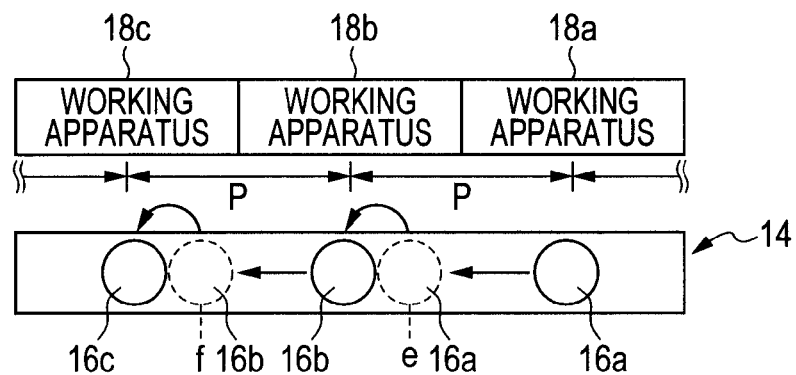
FIG. 2A is a diagram illustrating operation cycles according to Examples 1 and 2 of the present invention.

First, there are described operations in a case where distances P between the working positions are equal and the working time periods of the respective working apparatuses 18a to 18c are not different. As illustrated in FIG. 2A, the workpiece held by the conveyor robot 16b is delivered to the conveyor robot 16c when the conveyor robot 16b moves (advances) to a position f. The conveyor robot 16b, which has delivered the workpiece, moves (retreats) to the original position, and receives a next workpiece from the conveyor robot 16a that has moved to a position e. The working time periods of the working apparatuses 18a and 18b are set to be staggered so that the conveyor robot 16b returns to the original position in synchronization with timing at which the conveyor robot 16a arrives at the position e, which is most efficient. Specifically, the working apparatus 18c is workable while the conveyor robot 16b retreats, and the working apparatus 18b is workable while the conveyor robot 16a retreats. Note that, in FIG. 2A, the conveyor robot on the upstream side moves to the position of the conveyor robot on the downstream side. In contrast, the conveyor robot on the downstream side may move to the position of the conveyor robot on the upstream side.

Example 2

Figure 2B:
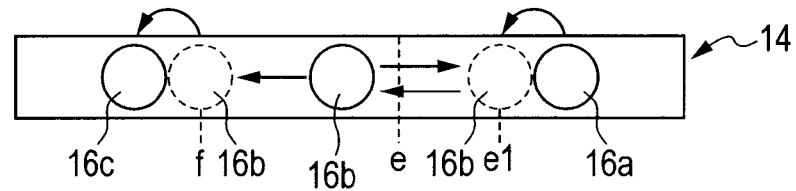
FIG. 2B is a diagram illustrating operation cycles according to Examples 1 and 2 of the present invention.

Next, there are described operations in a case where the distances P between the working positions are equal and the working time period of the working apparatus 18a is significantly longer than those of the working apparatuses 18b and 18c. As illustrated in FIG. 2B, in the case where the working time period of the working apparatus 18a is long, the conveyor robot 16b moves to the position e1, and receives the workpiece from the conveyor robot 16a. Specifically, while the working apparatus 18a performs the work on the workpiece held by the conveyor robot 16a, the conveyor robot 16b retreats to the position e1 and then waits. When the work of the working apparatus 18a is completed, the conveyor robot 16a delivers the workpiece to the conveyor robot 16b, and the conveyor robot 16b advances by the distance P to convey the workpiece. Then, the work is performed at the working position of the working apparatus 18b. When the work of the working apparatus 18b is completed, the conveyor robot 16b advances by the distance P to convey the workpiece, and delivers the workpiece to the conveyor robot 16c at the position f. As described above, in the case where the working time period of the working apparatus 18a is long, the conveyor robot 16b takes over the distance for the conveyor robot 16a to convey the workpiece, and the position to deliver the workpiece from the conveyor robot 16a to the conveyor robot 16b is changed. Thus, it is possible to cut one cycle time period as compared to that of a conventional conveying system.

FIG. 2C is a timing chart of the operations illustrated in FIG. 2B. It is understood that, when the conveyor robot 16b advances and retreats while the working apparatus 18a performs the work, the conveyor robot 16a neither advances nor retreats.

Comparative Example 1

Figure 9A:
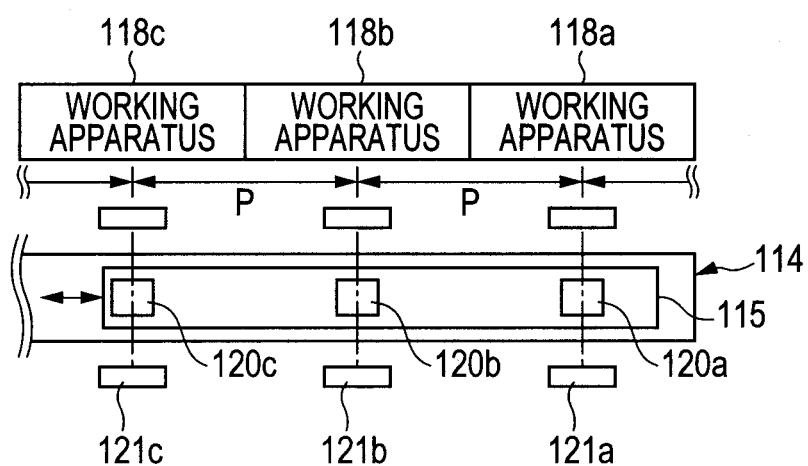
FIG. 9A is a diagram illustrating an operation cycle according to Comparative Example 1.
Figure 9B:
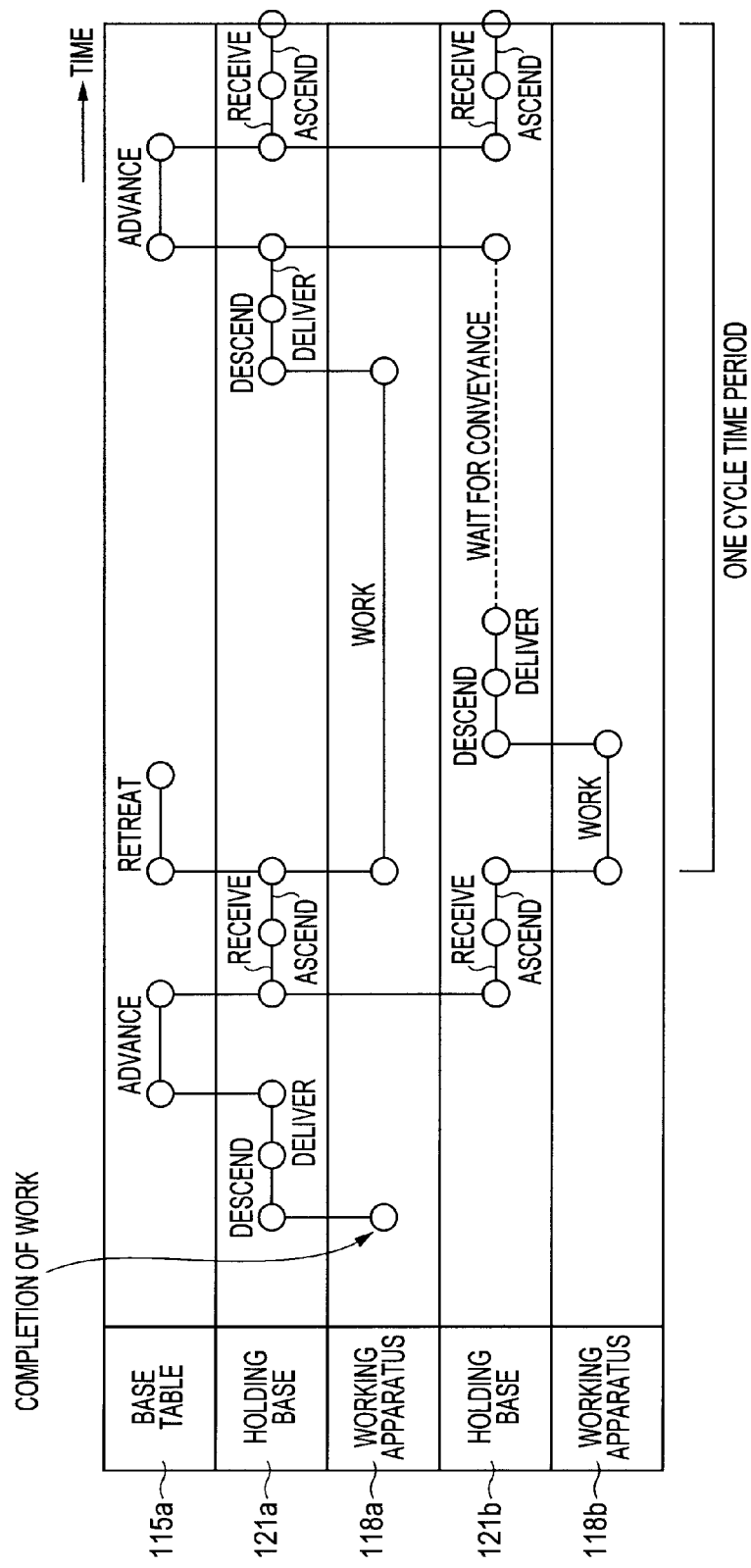
FIG. 9B is a diagram illustrating an operation cycle according to Comparative Example 1.
Figure 10:
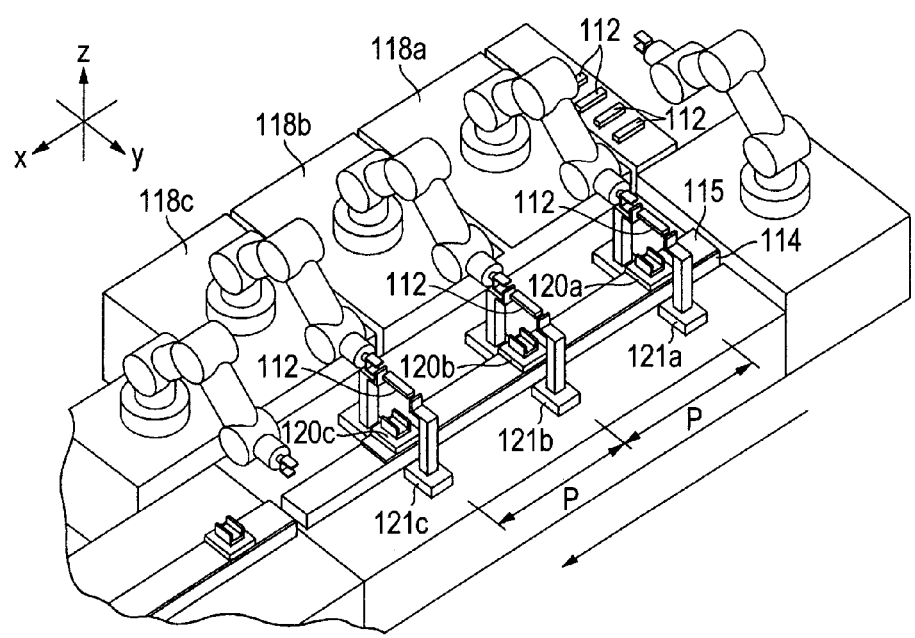
FIG. 10 is a perspective view of a work conveying system according to a conventional example.

For comparison, with reference to FIGS. 9A and 9B, there are described operations in a case where the distances P between the working positions are equal and the working time period of the working apparatus 18a is significantly longer than those of the working apparatuses 18b and 18c in the conventional conveying system illustrated in FIG. 10. FIG. 9A is a schematic view of the conventional conveying system illustrated in FIG. 10, and FIG. 9B is a timing chart. As illustrated in FIGS. 9A and 9B, in the conventional conveying system, when a work of a working apparatus 118a is completed, a holding base 121a descends and releases the workpiece to deliver to a jig 120a, and a base table 115 conveys the workpiece by the distance P. A holding base 121b holds the workpiece and ascends, to thereby receive the workpiece from the jig 120a. Then, the holding base 121b moves to a working position of a working apparatus 118b. The base table 115 retreats while the working apparatus 118b performs the work. Through repetition of the above-mentioned operations, the workpieces are sequentially conveyed. However, in a case where the workpieces are successively conveyed and the multiple working apparatuses perform the works, timing at which the workpiece is conveyed to the subsequent working apparatus corresponds to a point in time when the works of all of the working apparatuses are completed. In the case where the working time period of the working apparatus 118a is long, even when the work of the working apparatus 118b is completed, it is impossible to convey the workpiece, and it is necessary to wait until completion of the work of the working apparatus 118a. Accordingly, one cycle time period becomes longer by the waiting time.

Example 3

Figure 3A:
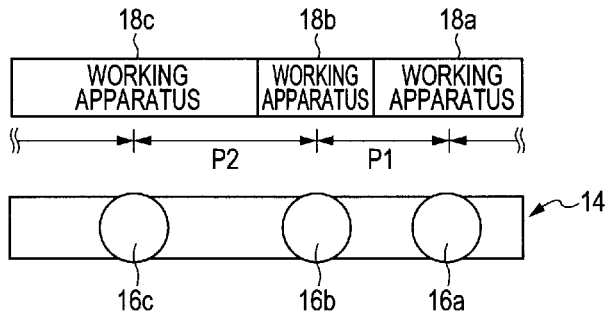
FIG. 3A is a diagram illustrating an operation cycle according to Example 3 of the present invention.

Next, there is described a case where the working time periods of the respective working apparatuses 18a to 18c are the same and a distance P1 between the working positions of the working apparatus 18a and the working apparatus 18b is longer than a distance P2 between the working positions of the working apparatus 18b and the working apparatus 18c. FIG. 3A is a schematic view of a conveying system, and FIGS. 3B and 3C are timing charts.

Figure 3B:
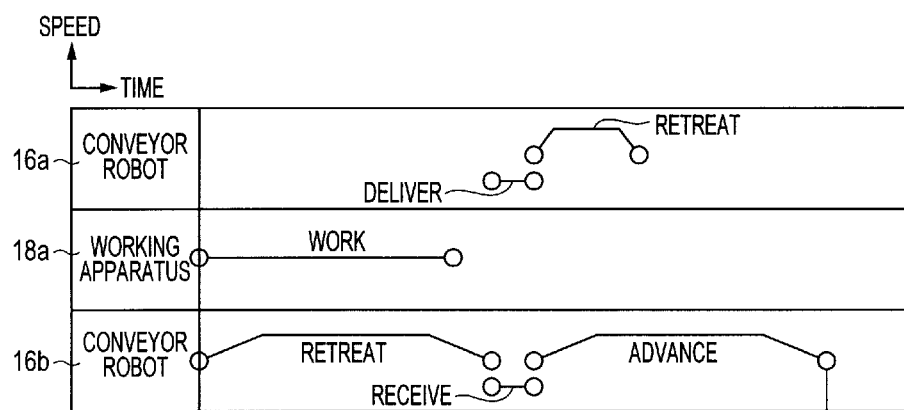
FIG. 3B is a diagram illustrating an operation cycle according to Example 3 of the present invention.
Figure 3C:
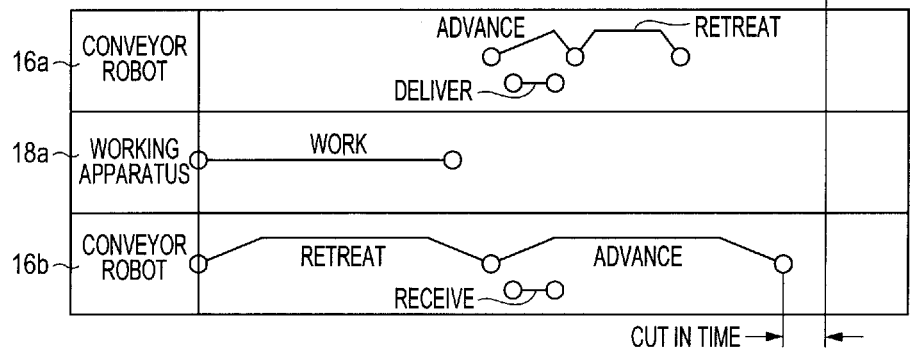
FIG. 3C is a diagram illustrating an operation cycle according to Example 3 of the present invention.

The timing chart of FIG. 3B illustrates operations in which, similarly to Examples 1 and 2 described above, the workpiece is delivered under a state in which the retreat operation of the conveyor robot 16b is completed and both the conveyor robots 16a and 16b stop. In contrast, the timing chart of FIG. 3C illustrates operations in which, after the conveyor robot 16b completes the retreat operation to stop next to the conveyor robot 16a, the workpiece is delivered while the conveyor robot 16a and the conveyor robot 16b are synchronized to advance at the same moving speed. That is, in the case of FIG. 3C, the advance operation of the conveyor robot 16b and the workpiece delivery operation performed between the two adjacent conveyor robots 16a and 16b are carried out in parallel. As a result, it is possible to further cut a conveying time period in one cycle.

Figure 4:
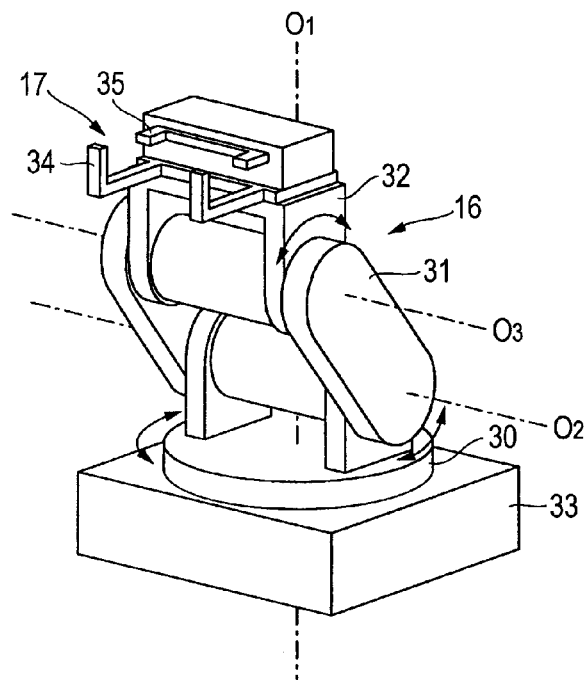
FIG. 4 is a perspective view of a conveyor robot.

FIG. 4 illustrates structure of each conveyor robot 16 (16a to 16d). The conveyor robot 16 is mounted on a table 30 that is rotatable by 180° or more about an O1-axis, and the conveyor robot 16 includes an arm 31 rotatable by 180° or more about an O2-axis above the table 30, and a head 32 rotatable by 180° or more about an O3-axis at a tip end of the arm. The head 32 includes, on its top, a hand 17 (17a to 17d) serving as a holding unit for holding the workpiece. The conveyor robot 16 drives the arm 31 and the head 32 constituting a workpiece delivery mechanism by a command output from a control unit, and moves the hand 17 to a desired position. The structure of the conveyor robot 16 described herein is merely an example, and the number of the arms and joints is not limited as long as the hand 17 can be moved to the desired position. Further, as a unit for rotating and driving the arm 31 and the head 32, a servomotor may be used, or a stepping motor may be used.

The hand 17 may be configured to attract the workpiece by a vacuum pad, but it is desired that the hand 17 have a form of connecting a stationary claw 34 and a movable claw 35 on the front surface of the head 32. The movable claw 35 horizontally moves the workpiece placed on the top surface of the stationary claw 34, and grips the workpiece. In this manner, it is possible to perform holding of the workpiece and highly precise positioning. It is more desired that the stationary claw 34 be able to hold the workpiece. Note that, the functions of the stationary claw 34 and the movable claw 35 may be interchanged, and both the two claws may be provided as movable claws.

As a unit for driving the movable claw 35, a pneumatic device such as an air cylinder may be used, or an electric motor using a ball screw or the like may be used. A method of detecting presence of the workpiece held by the hand 17 may include detecting performed by current control using a motor. A position, at which the movable claw 35 detects the presence of the workpiece, is set in advance according to the size of the workpiece as a maximum operation distance and a minimum operation distance not in terms of point but in terms of range, to thereby be used as a detection range of detecting the workpiece. When the movable claw 35 is operated by the command of the control unit to come into contact with the workpiece in the above-mentioned detection range, there is measured a time period during which a moving amount of the movable claw 35 does not change with respect to a predetermined command time period. At the point in time after elapse of a certain time period, it is recognized that the workpiece is held.

Figure 5A:
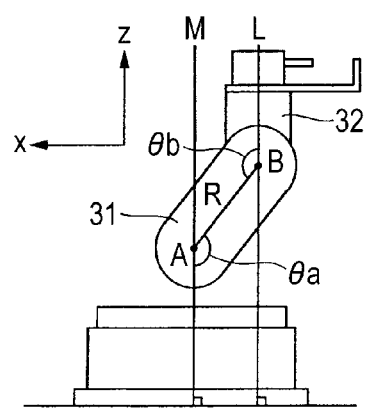
FIG. 5A is a diagram illustrating an operation of the conveyor robot.
Figure 5B:
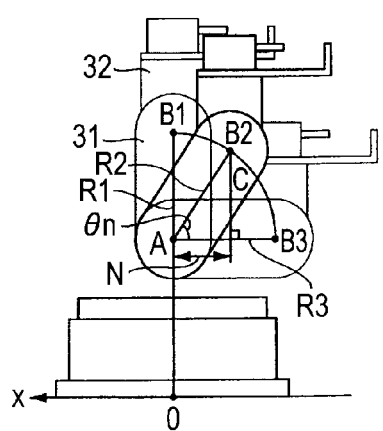
FIG. 5B is a diagram illustrating an operation of the conveyor robot.

Next, with reference to FIGS. 5A and 5B, there is described a method in which the conveyor robot 16 does not have an axis for linear drive in a z direction and the head 32 is linearly moved up and down in the z-axis direction. In FIG. 5A, a point A indicates a rotation center of the arm 31, and a point B indicates a rotation center of the head 32. The point A and the point B are connected by a straight line R. A vertical line M is drawn from the point A to the rail track surface. Similarly, a vertical line L is drawn from the point B. The vertical line M and the straight line R form an angle ea at the intersection A, the angle ea being referred to as a rotation angle of the arm 31. Similarly, the vertical line L and the straight line R form an angle θb at the intersection B, the angle θb being referred to as a rotation angle of the head 32. In order to perform up-and-down movement while keeping the posture of the head 32 horizontal, the rotation angle θa of the arm 31 and the rotation angle θb of the head 32 are controlled so as to satisfy the following equation:

$$\theta a = \theta b \qquad (1)$$

The head 32 is operated to move along an arc. Thus, the head 32 moves in the z direction and simultaneously moves in an x direction. In order to move the head 32 perpendicularly to the rail track surface of the conveying system, the conveyor robot 16 moves in an opposite x direction opposite to the moving direction of the head 32 by the same distance as the moving distance of the head 32 in the x direction. As a result, the head 32 is prevented from moving in the x direction.

More specifically, in FIG. 5B, the straight lines R (R1 to R3) connecting between the point A and the points B (B1 to B3) are drawn. The straight line R and a horizontal line passing the point A form an angle θn. The horizontal line and the straight line R passing the point B1 when the arm 31 is in a vertical posture form an angle of 90°, and the horizontal line and the straight line R passing the point B3 when the arm 31 is in a horizontal posture form an angle of 0°. The moving amount of the head 32 in the x direction, which is accompanied when the arm 31 and the head 32 are operated so as to satisfy the equation (1), is denoted by reference symbol N. When a value of the angle θn of the straight line R is 0°<θn<90°, a straight line extending vertically from the point B to the rail track surface, and the straight line R3 extending horizontally intersect at a point C. The point B moves from the point B1 to the point B3 on a circumference of a circle that is formed by rotation of the straight line R about the point A. The moving amount N of the conveyor robot 16 in the x direction, which prevents the head 32 from moving in the x direction, is equal to a length of a base of a right-angled triangle that has vertices at the point A, the point B, and the point C and is tangent at the point B to a circle having a radius R and a center at the point A. That is, N is represented by the following equation (2):

$$N = R \cdot \cos \theta n \qquad (2)$$

The moving amount N of the conveyor robot 16 on the rail track and rotation of the arm 31 and the head 32 are controlled so as to satisfy the equations (1) and (2). As a result, it is possible to vertically move the head 32 while keeping the posture of the head 32 parallel to the rail track surface.

Figure 6A:
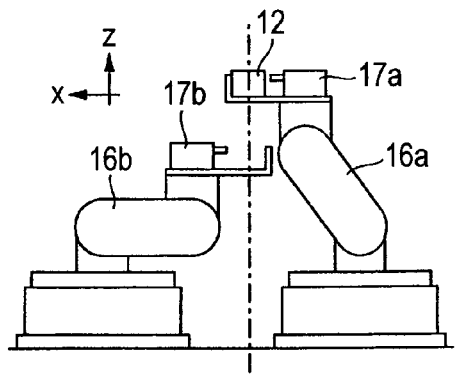
FIG. 6A is a step diagram illustrating an operation of delivering a workpiece.
Figure 6B:
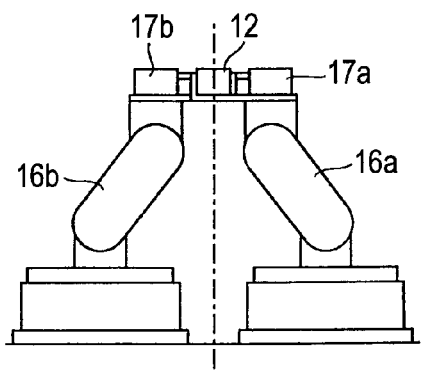
FIG. 6B is a step diagram illustrating an operation of delivering a workpiece.
Figure 6C:
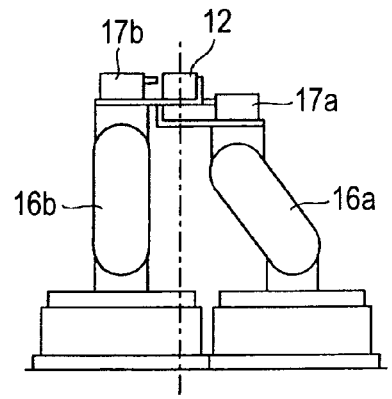
FIG. 6C is a step diagram illustrating an operation of delivering a workpiece.

FIGS. 6A to 6C illustrate a method of delivering the workpiece between the two adjacent conveyor robots. When the conveyor robot 16a situated on the upstream side arrives at the position to deliver the workpiece 12, as illustrated in FIG. 6A, the conveyor robot 16b situated on the downstream side takes such a posture as to crawl under the workpiece 12. Next, as illustrated in FIG. 6B, the conveyor robot 16b raises the hand 17b, and as illustrated in FIG. 6C, the conveyor robot 16b is operated so as to scoop up the workpiece 12, to thereby receive the workpiece from the conveyor robot 16a. The delivery of the workpiece in this manner minimizes movement of the workpiece, and enables more stable delivery.

Alternatively, when the conveyor robot 16a and the conveyor robot 16b are at the position to deliver the workpiece 12, the conveyor robot 16a may lower the workpiece 12, to thereby deliver the workpiece 12 to the conveyor robot 16b. Further, the conveyor robot 16a and the conveyor robot 16b may be operated simultaneously, to thereby deliver the workpiece.

Figure 7:
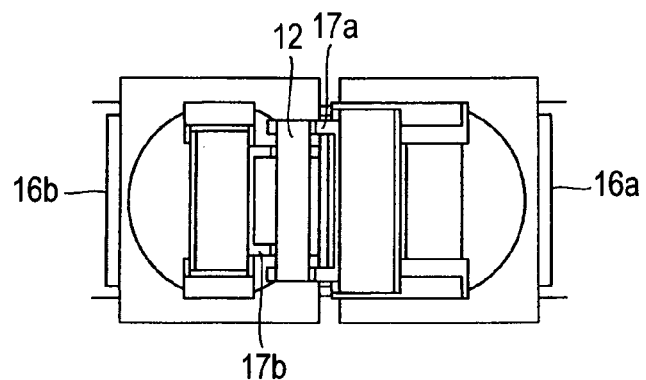
FIG. 7 is a top view illustrating a mechanism for delivering a workpiece.

FIG. 7 illustrates a state when the conveyor robot 16a and the conveyor robot 16b are at the position to deliver the workpiece 12. The hand 17a of the conveyor robot 16a for delivering the workpiece 12 is shaped so as to hold the outer side of the workpiece 12, whereas the hand 17b of the conveyor robot 16b for receiving the workpiece 12 is shaped so as to hold the inner side of the workpiece 12. As a result, it is possible to deliver the workpiece without interference between the hands. Further, there may be adopted such a combination that the hand of the conveyor robot for delivering the workpiece is shaped so as to hold the inner side of the workpiece, whereas the hand of the conveyor robot for receiving the workpiece is shaped so as to hold the outer side of the workpiece. Alternatively, there may be also adopted such a combination that the conveyor robot for delivering the workpiece has a form of holding the outer side of the workpiece by one claw and holding the inner side of the workpiece by the other claw, whereas the conveyor robot for receiving the workpiece has two claws in the opposite form to that of the conveyor robot for delivering the workpiece.

Each of the conveying apparatuses 10 and 11 includes, for example, multiple carriers with respect to one rail track, and constitutes a linear motor having linear or curved structure in which each of the carriers includes an independently moving unit.

Figure 8:
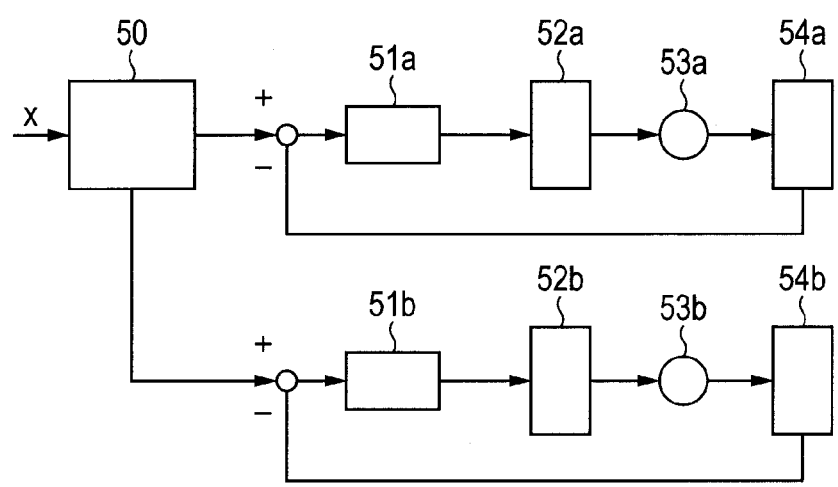
FIG. 8 is a block diagram illustrating control performed by an electronic cam.

FIG. 8 illustrates a control method using an electronic cam for moving the head of the conveyor robot perpendicularly to the rail track surface. A moving axis of the conveyor robot in the x direction is referred to as a main axis, and rotation axes of the arm and the head of the conveyor robot are referred to as dependent axes that follow the main axis. In order to linearly move up and down the head in the z-axis direction though the conveyor robot does not have a linear axis in the z direction, by using the equation (1) and the equation (2), rotational moving amounts of the arm and the head with respect to the moving amount of the conveyor robot in the x direction are calculated. The calculated moving amount of the arm and the calculated moving amount of the head with respect to the moving amount of the main axis are generated by a cam curve, and are stored in a cam table 50. Information of a current position of linear movement of the conveyor robot in the x direction is input, and positional commands are generated, using the cam table 50, for servomotors 53*a* and 53*b* of the arm and the head of the conveyor robot, respectively. According to the position of the conveyor robot that momently moves, the positional commands for the servomotors 53*a* and 53*b* are generated. Speed control systems 51*a* and 51*b* differentiate the positional commands so as to generate speed commends, and at the same time generate correction amounts using differences of positional information fed back by pulse transmitters 54*a* and 54*b* that are connected to the servomotors 53*a* and 53*b*, respectively. The servomotors 53*a* and 53*b* are each subjected to speed control using the speed commend to which the correction amount is added. In this manner, electronic cam control is performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-109925, filed May 12, 2010, which is hereby incorporated by reference herein in its entirety.

What is claimed is:

1. A work conveying system for sequentially conveying a workpiece to multiple working apparatuses, each working apparatus having a working position, the work conveying system comprising:
   a rail track disposed along the multiple working apparatuses;
   multiple conveyor robots, each conveyor robot (i) being disposed on the rail track and (ii) moving on the rail track independently; and
   a delivery control unit to control the multiple conveyor robots for delivering the workpiece directly between adjacent conveyor robots,
   wherein any one of the multiple conveyor robots can be controlled for isolated individual movement on the rail track between adjacent working apparatuses to thereby sequentially deliver the workpiece,
   wherein the delivery control unit changes a conveyance distance of at least one conveyor robot, the conveyance distance being a distance between the working position of one of the working apparatuses and a position where the workpiece held by the at least one conveyor robot is delivered between the at least one conveyor robot and one of the adjacent conveyor robots, and
   wherein the delivery control unit changes the conveyance distance of the at least one conveyor robot depending on at least one of (i) a distance between each of the working positions of adjacent working apparatuses and (ii) a working time at the working position of one of the working apparatuses.

2. The work conveying system according to claim 1, wherein the delivery control unit determines an operation of the delivery such that adjacent conveyor robots perform delivery while moving at the same moving speed in accordance with an operation of the conveyor robot with a longer conveyance distance.

3. A work conveying system for sequentially conveying a workpiece to multiple working apparatuses, each working apparatus having a working position, the work conveying system comprising:
   a rail track disposed along the multiple working apparatuses;
   multiple conveyor robots, each conveyor robot (i) being disposed on the rail track and (ii) moving on the rail track independently; and
   a delivery control unit to control the multiple conveyor robots for delivering the workpiece directly between adjacent conveyor robots,
   wherein any one of the multiple conveyor robots can be controlled for isolated individual movement on the rail track between adjacent working apparatuses to thereby sequentially deliver the workpiece,
   wherein each conveyor robot has a conveyance distance, the conveyance distance being a distance between the working position of the working apparatus corresponding to the respective conveyor robot and a position where the workpiece held by the respective conveyor robot is to be delivered between the respective conveyor robot and an adjacent conveyor robot,
   wherein the delivery control unit changes the conveyance distance of at least one conveyor robot, the one conveyor robot being a controlled conveyor robot, and
   wherein the delivery control unit changes the conveyance distance of the controlled conveyor robot depending on at least one of (a) a distance between the working position of the working apparatus corresponding to the controlled conveyor robot and the working position of an adjacent working apparatus and (b) a working time at the working position of at least one of (i) the working apparatus corresponding to the controlled conveyor robot and (ii) the adjacent working apparatus.

4. The work conveying system according to claim 3, wherein the delivery control unit determines an operation of the delivery such that adjacent conveyor robots perform delivery while moving at the same moving speed in accordance with an operation of the conveyor robot with a longer conveyance distance.

* * * * *